(12) United States Patent
Geske et al.

(10) Patent No.: US 9,746,513 B2
(45) Date of Patent: Aug. 29, 2017

(54) CIRCUIT ARRANGEMENT WITH A THYRISTOR CIRCUIT, AS WELL AS A METHOD FOR TESTING THE THYRISTOR CIRCUIT

(71) Applicant: GE Energy Power Conversion GmbH, Berlin (DE)

(72) Inventors: Martin Geske, Berlin (DE); Robert Oesterle, Berlin (DE); Siegfried Nowak, Berlin (DE)

(73) Assignee: GE ENERGY POWER COVERSION GMBH (DE)

( * ) Notice: Subject to any disclaimer, the term of this patent is extended or adjusted under 35 U.S.C. 154(b) by 116 days.

(21) Appl. No.: 14/692,917

(22) Filed: Apr. 22, 2015

(65) Prior Publication Data

US 2015/0309108 A1 Oct. 29, 2015

(51) Int. Cl.
*G01R 31/26* (2014.01)

(52) U.S. Cl.
CPC .................... *G01R 31/263* (2013.01)

(58) Field of Classification Search
CPC ............................. G01R 31/263; G01R 31/42
USPC ........................................ 324/750.01, 762.01
See application file for complete search history.

(56) References Cited

U.S. PATENT DOCUMENTS

| | | | |
|---|---|---|---|
| 4,471,301 A | 9/1984 | Durov et al. | |
| 4,641,231 A | 2/1987 | Walker et al. | |
| 4,675,800 A * | 6/1987 | Seki | H02M 1/088 327/441 |
| 5,521,526 A * | 5/1996 | Nyberg | G01R 31/263 324/762.01 |

(Continued)

FOREIGN PATENT DOCUMENTS

| | | |
|---|---|---|
| CN | 2884219 Y | 3/2007 |
| CN | 201941777 U | 8/2011 |

(Continued)

OTHER PUBLICATIONS

Germany Office Action issued in connection with corresponding DE Application No. 102014105719.8 on Dec. 18, 2014.

(Continued)

*Primary Examiner* — Melissa Koval
*Assistant Examiner* — Courtney McDonnough
(74) *Attorney, Agent, or Firm* — GE Global Patent Operation; Scott R. Stanley (57) ABSTRACT

A thyristor circuit comprising at least one series circuit in which two or more thyristors are connected in series. Each thyristor is parallel-connected to an RC member. A control device can energize the thyristors individually and independently of each other by a control signal, so that each thyristor can be individually switched into its conducting condition. During a test sequence, the thyristors are switched successively into their conducting condition, wherein, in a series circuit and/or in the thyristor circuit, respectively only one thyristor is in its conducting condition. While a thyristor is conducting, the capacitor of the associate RC member discharges and produces a thyristor current. As a result, the conducting condition is maintained until the thyristor current falls below the holding current. The control device can use the thyristor voltage and/or the thyristor current to evaluate the function or the switching behavior of the thyristor.

13 Claims, 5 Drawing Sheets

(56) References Cited

U.S. PATENT DOCUMENTS

| | | | |
|---|---|---|---|
| 5,521,593 A | 5/1996 | Kumar | |
| 6,211,792 B1 * | 4/2001 | Jadric | H02H 7/0844 318/800 |
| 7,486,099 B1 | 2/2009 | Manika | |
| 2002/0149388 A1 | 10/2002 | Messick | |

FOREIGN PATENT DOCUMENTS

| | | |
|---|---|---|
| CN | 101806853 B | 2/2012 |
| CN | 101672887 B | 1/2013 |
| CN | 102055307 B | 5/2013 |
| DE | 2552577 A1 | 6/1976 |
| DE | 3641441 A1 | 6/1987 |
| DE | 3627114 A1 | 2/1988 |
| DE | 3937115 A1 | 5/1991 |
| DE | 4104376 A1 | 8/1992 |
| DE | 4132745 A1 | 4/1993 |
| DE | 4300620 C1 | 7/1994 |
| DE | 10230527 A1 | 1/2004 |
| DE | 102004029023 A1 | 2/2005 |
| DE | 102008060975 A1 | 6/2010 |
| DE | 102011054147 A1 | 4/2012 |
| EP | 73059 A1 | 3/1983 |
| EP | 249123 A1 | 12/1987 |
| EP | 0478811 A1 | 4/1992 |
| EP | 0980142 A2 | 2/2000 |
| JP | 6280567 A | 4/1987 |
| WO | 9956141 A1 | 11/1999 |
| WO | 02067003 A1 | 8/2002 |
| WO | 2010063490 A1 | 6/2010 |

OTHER PUBLICATIONS

European Search Report and Opinion issued in connection with corresponding EP Application No. 15164535.5 on Sep. 15, 2015.

Ya-Ming et al., "On-Line Diagnosis of Power Thyistors in Generator Static Excitation System Using Expert System", Industrial Electronics Society, 1988. IECON '88. Proceedings., 14 Annual Conference of (vol. 1), pp. 140-145, Oct. 1988.

Astrom et al., "Alternative Solutions for Thyristor Control and Gating for HVDC-Valves", Power System Technology, 1998. Proceedings. Powercon '98. 1998 International Conference, pp. 479-482, Aug. 1998.

* cited by examiner

CIRCUIT ARRANGEMENT WITH A THYRISTOR CIRCUIT, AS WELL AS A METHOD FOR TESTING THE THYRISTOR CIRCUIT

BACKGROUND OF THE INVENTION

Embodiments of the invention relate to a circuit arrangement with a thyristor circuit comprising at least one series circuit with at least two thyristors. Furthermore, embodiments of the invention relate to a method for testing such a thyristor circuit. Series circuits using several thyristors are frequently used to achieve a sufficiently high blocking voltage of a terminal with respect to a supply voltage and a redundancy. As a result of this, it is possible, for example, to avoid a destruction of the thyristors due to overvoltages. In doing so, it is desirable or required that the thyristors of the thyristor circuit be tested regarding their functionality.

Regarding this, prior art has provided suggestions. Considering the method for testing a thyristor known from publication DE 3640546 A1, an appropriate signal may be used in order to switch the thyristor into the conducting condition. A logic circuit verifies whether the thyristor is in its conducting condition, even though there is no appropriate control signal at its control input terminal. An appropriate error signal can be generated therefrom. Also, publication WO 93/11610 A1 has suggested monitoring the state of the circuit of a gate-turn-off thyristor by means of an appropriate monitoring logic circuit.

A method and a device for monitoring the functionality of electronic power components have been known from publication DE 10230527 A1. It suggests that a high-frequency electrical testing parameter be applied to the component to be tested. The voltage distribution due to the testing parameter is measured and, based thereon, the functionality of the tested component is determined.

Publication CN 101806853 A describes an online method for testing a thyristor. A resistor is connected in series to the thyristor, said resistor being connected to the anode. An RC member is connected between the anode and a thyristor driver. Additional terminals of the thyristor driver are connected to the control input of the thyristor as well as to the cathode. The current flowing through the series circuit consisting of the resistor and the thyristor, as well as the voltage at the resistor and the thyristor voltage between the anode and the cathode, are measured and transmitted to a control device. The control device energizes a switch that is provided parallel to the series resistor, so that the current and the voltage on the thyristor can be changed depending on whether the switch is open or closed. Depending on the energization of the switch and the measured values for current and voltage, it is possible to draw conclusions regarding the functionality of the thyristor.

Considering this prior art, the provision of a simple testing of a thyristor circuit may be regarded as being the object of embodiments of the invention.

SUMMARY OF THE INVENTION

This object is achieved by a circuit arrangement exhibiting the features of patent claim 1, as well as by a method exhibiting the features of patent claim 17.

The thyristor circuit comprises one or more series circuits. Each series circuit contains at least two thyristor groups, each comprising one thyristor or two thyristors that are connected anti-parallel in series with respect to each other. A supply voltage may be applied to the first terminal side of the series circuit. The opposite, second terminal side of the series circuit acts as the starting node where—more or less—the supply voltage is applied when the thyristors of the series circuit are conducting. The supply voltage can be blocked with respect to the starting nodes via the series connection of the majority of thyristor groups.

The supply voltage may be a dc voltage or an ac voltage. If it is a dc voltage, one thyristor per thyristor group is sufficient. In the event of an ac voltage as the supply voltage, two anti-parallel thyristors may be present in each thyristor group.

Each thyristor group has one RC member. The RC member is connected parallel to at least one thyristor and is thus connected to the anode on one side and to the cathode on the other side of each thyristor. The RC member comprises a series circuit comprising a capacitor and a first resistor. In an embodiment, the capacitor is additionally connected parallel to a second resistor.

Furthermore, the circuit arrangement comprises a control device. The control device is connected to the control input terminals of the thyristors via the control lines. The control device is intended and adapted to separately and individually control the thyristors, so that each thyristor can be switched individually into its respectively conducting condition when the control device applies a control signal to its control input terminal—via the respective control line—for switching the thyristor into the conducting condition.

Furthermore, the control device is adapted to perform a test sequence. Considering this test sequence, in an embodiment, all or several selected thyristors of the thyristor circuit are energized successively, individually or in groups, by means of a control signal. This control signal is disposed to switch the thyristors into their respective, conducting condition. Only one thyristor or one group comprising several thyristors can be in its conducting condition. The number of thyristors that can be simultaneously switched into the conducting condition in a shared series circuit during the test sequence depends on the dimensioning of the series circuit. It must be ensured that the remaining, blocking thyristors of the series circuit still provide a sufficient blocking voltage. A control signal for another thyristor is thus generated during the test sequence only if at least one or all the previously conducting thyristors in the test sequence are again in a blocking condition.

In embodiments of the circuit arrangement, the thyristors are those that receive a current pulse on their control input terminal (gate) via the control signal and can thus transition into the conducting condition. A switching from the conducting into the blocking condition via the control signal is not necessary and not possible in the thyristor types provided herein.

During the test sequence, the series circuit is unable to conduct current. The non-conducting thyristors present in the series circuit provide a sufficient blocking voltage of the series circuit with respect to the supply voltage. After generating a control signal during the test sequence, the thyristor current required for switching the respective thyristor into the conducting condition, said thyristor current needing to correspond at least to the holding current of the thyristor, is produced by the electrical charge stored in the capacitor of the RC member. As soon as the capacitor has discharged to such an extent that the thyristor current generated thereby falls below the value of the holding current, the thyristor again returns into its blocking condition. Subsequently, the next thyristor in the test sequence can be energized via the control signal.

In this manner, it is possible to switch the individual thyristors for a short period into their conducting condition, even though the series circuit comprising several thyristors prevents, in particular, a current flow through the series circuit. Additional measuring devices are not required. The thyristor circuit can be tested by the control device that is already provided for the operation of said thyristor circuit. Corresponding testing of the thyristors can be performed very rapidly without additional testing means.

In an embodiment, if the control device is adapted to switch only one thyristor of a series circuit or one group of the thyristor circuit at a time into the conducting condition.

In an embodiment, the control device is adapted to measure and evaluate at least once, or several times or continuously, the thyristor voltage applied between the anode and the cathode of this thyristor during a test period following the application of the control signal to one of the thyristors. As a result of this, a conclusion regarding the condition of the thyristor and/or its functionality is possible.

Therefore, during the test sequence a provision is made for testing the switching of the respectively energized thyristor into the conducting condition and, optionally, back into the blocking condition by means of a characteristic electrical parameter such as, for example, the thyristor voltage. For evaluating the thyristor, the following electrical parameters can be used, individually or in any combination:

The thyristor voltage between the anode and the cathode of the thyristor,

The thyristor current from the anode to the cathode of the thyristor,

The gate voltage between the gate and the cathode of the thyristor,

The capacitor voltage applied to the capacitor of the RC member.

In doing so, the thyristor current or snubber current may be determined, for example, in view of the voltage on the first resistor of the RC member or by means of a separate power converter in a thyristor driver associated with the thyristor group.

With the thyristor voltage it can be determined whether the tested thyristor can be ignited, i.e., be switched into its conducting condition, and also whether there is a short circuit of the thyristor. If the voltage falls below an associate threshold already before the control pulse or before expiration of an ignition delay period, it may be concluded that a short circuit of the thyristor exists. If the thyristor voltage does not sufficiently decrease after passage of the ignition delay time period and falls below an associate threshold, it may be concluded that an ignition fault exists.

Furthermore, in an embodiment, if, in addition to the evaluation of the at least one thyristor of each of the thyristor groups, there is at least one testing of the RC member. As soon as the thyristor begins to conduct, the capacitor of the RC member discharges via the first resistor. The maximum thyristor current occurring in conjunction with this and the original maximum capacitor voltage can be used to determine the resistance value of the first resistor based on Ohm's Law. If this resistor value is known, it is possible, by determining the thyristor current or the capacitor voltage during the discharge phase of the capacitor, to determine the capacitor's capacitance and/or the time constant of the RC member (product of the capacitance of the capacitor and of the resistance value). As a result of this, it is possible, for example, to measure changes of the components of the RC member, for example due to aging.

In an embodiment, the control device may be adapted to compare the electrical parameter that is used, for example the thyristor voltage, with at least one threshold value. Additionally, it is also possible in conjunction with this to take into account the chronological behavior of the change of the electrical parameter, for example the thyristor voltage, in an embodiment in such a manner that an reaching or rising above, or falling below, a predetermined threshold must additionally occur within an appropriate, predetermined time duration.

For example, the control device may be adapted to monitor the test period during the evaluation of the thyristor voltage to see whether the thyristor voltage decreases. To do so, in an embodiment, a first threshold value may be predetermined and it can be monitored whether the thyristor voltage falls below the first threshold during the test period. Additionally, it is also possible to monitor whether the thyristor voltage falls below the predetermined first threshold within the ignition delay period (time duration until the thyristor voltage since the application of the control signals has fallen to 90% of the starting value) or below a predetermined conduction delay time since the application of the control signal.

Furthermore, in an embodiment, if the control device is adapted to monitor whether the thyristor voltage initially falls during the test period and subsequently rises again. In particular, it is possible in conjunction with this to monitor whether the thyristor voltage rises after falling below the first threshold and, for example, rises above a predetermined second threshold.

The rise of the thyristor voltage during the test period is accomplished in that the thyristor switches from its conducting condition into the blocking condition. In an embodiment, this is achieved in that the thyristor current resulting from the discharge of the capacitor of the RD member falls below the holding current necessary to maintain the conducting condition of the thyristor. The thyristor current falls below the holding current at a point in time during the test period.

In an embodiment, the control device may be adapted to monitor whether the thyristor voltage rises above the second threshold within a predetermined blocking delay time. The blocking delay time begins at that point of time at which the thyristor current, due to the discharge of the capacitor, falls below the holding current.

In an embodiment the control device comprises several thyristor drivers. Each thyristor or each thyristor group of the thyristor circuit is associated with a thyristor driver. The thyristor driver is connected to the control input terminal of the associate thyristor or thyristors of the associate thyristor group. In an embodiment, the thyristor drivers have one or more additional measuring terminals to be able to measure, for example, the thyristor voltage between the anode and the cathode of the associate thyristor. Additionally or alternatively, it is possible, for example, to measure or determine the thyristor current via the at least one measuring terminal. The measuring terminals are selected in such a manner that the aforementioned electrical parameters for evaluating the thyristor and/or the RC member can be measured.

After igniting and again blocking a thyristor, the thyristor voltage applied to the respective thyristor group is no longer the same compared with the other thyristor voltages in the series circuit. A voltage difference is formed. This voltage difference between the thyristor voltages of a series circuit is eliminated again when all the thyristor groups of a series circuit have been energized once by the control signal.

If an ac voltage is used as the supply voltage, the control signal for all thyristor groups is, in an embodiment, generated by the same phase angle of the supply voltage. Furthermore, in an embodiment, the control signal is generated by a phase angle that is close to the zero crossing, for example, at most 10% of the duration of the period of the supply voltage (ac voltage) remote from the zero crossing. In doing so, in an embodiment, if the anti-parallel thyristors of a thyristor group are ignited successively by a control pulse in such a manner that the one thyristor is ignited during the positive half-wave and the other thyristor is ignited—in an embodiment directly subsequent to or directly previous to—during the negative half-wave. In doing so, in an embodiment, if the phase difference with respect to the subsequent zero crossing of the respective half-wave is the same at the time the associate thyristor is ignited. As a result of this, a voltage difference on the thyristor group with anti-parallel thyristors can be reduced and, in the ideal case, eliminated.

Furthermore, the control device may comprise a system control unit that is disposed to control the thyristor drivers.

BRIEF DESCRIPTION OF THE DRAWINGS

Embodiments of the invention can be inferred from the dependent patent claims, the description and the drawings. Hereinafter, exemplary embodiments of the present invention will be explained in detail with reference to the appended drawings. They show in:

DETAILED DESCRIPTION OF THE INVENTION

Figure 1:
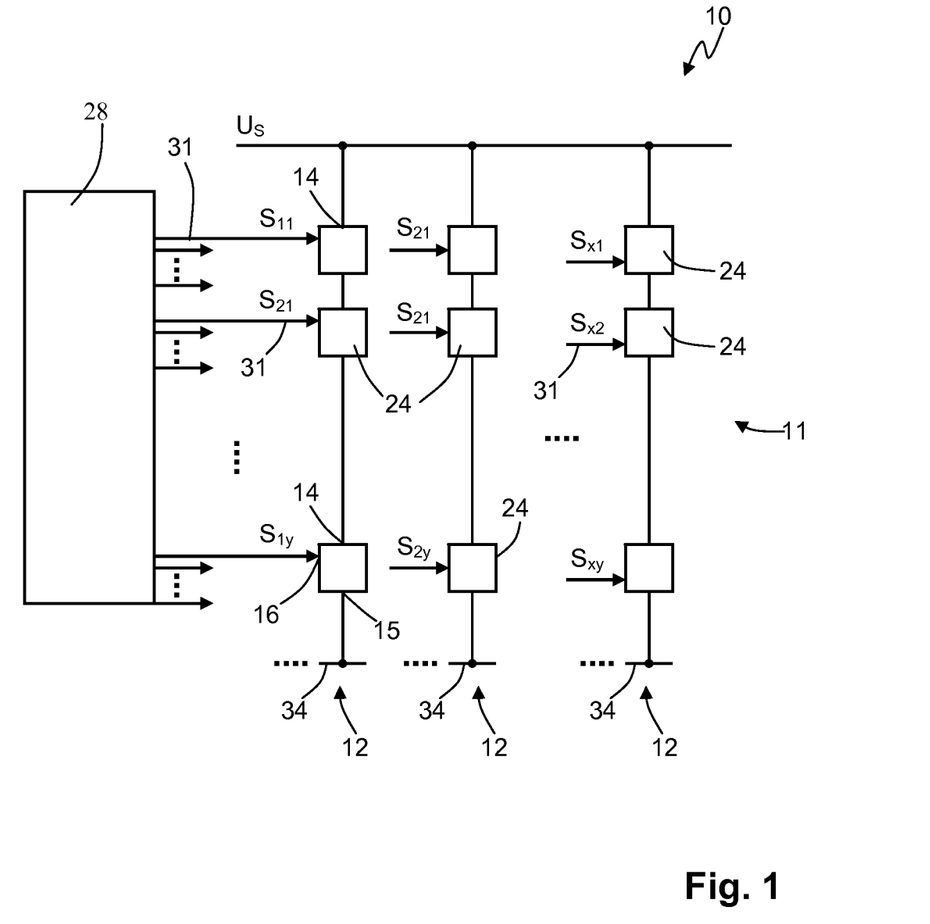
FIG. 1 a block diagram of an exemplary embodiment of a circuit arrangement with a thyristor circuit and a control device controlling a thyristor circuit, FIG. 2 a partial representation of a series circuit of the thyristor circuit of FIG. 1 in the block diagram, FIG. 3A the schematic time sequence of a supply voltage $U_S$, FIG. 3B the schematic time sequence of a thyristor current $I_T$, FIG. 3C the schematic time sequence of a thyristor voltage $U_{AK}$, FIG. 3D the schematic time sequence of the thyristor voltage $U_{AK}$ of FIG. 3C during the test period DT, FIG. 4 a partial illustration of a series circuit of another exemplary embodiment of a thyristor circuit in a block diagram, and FIG. 5 the schematic time sequence of a thyristor voltage $U_{AK}$ on the thyristor group in the exemplary embodiment of FIG. 4.
Figure 4:
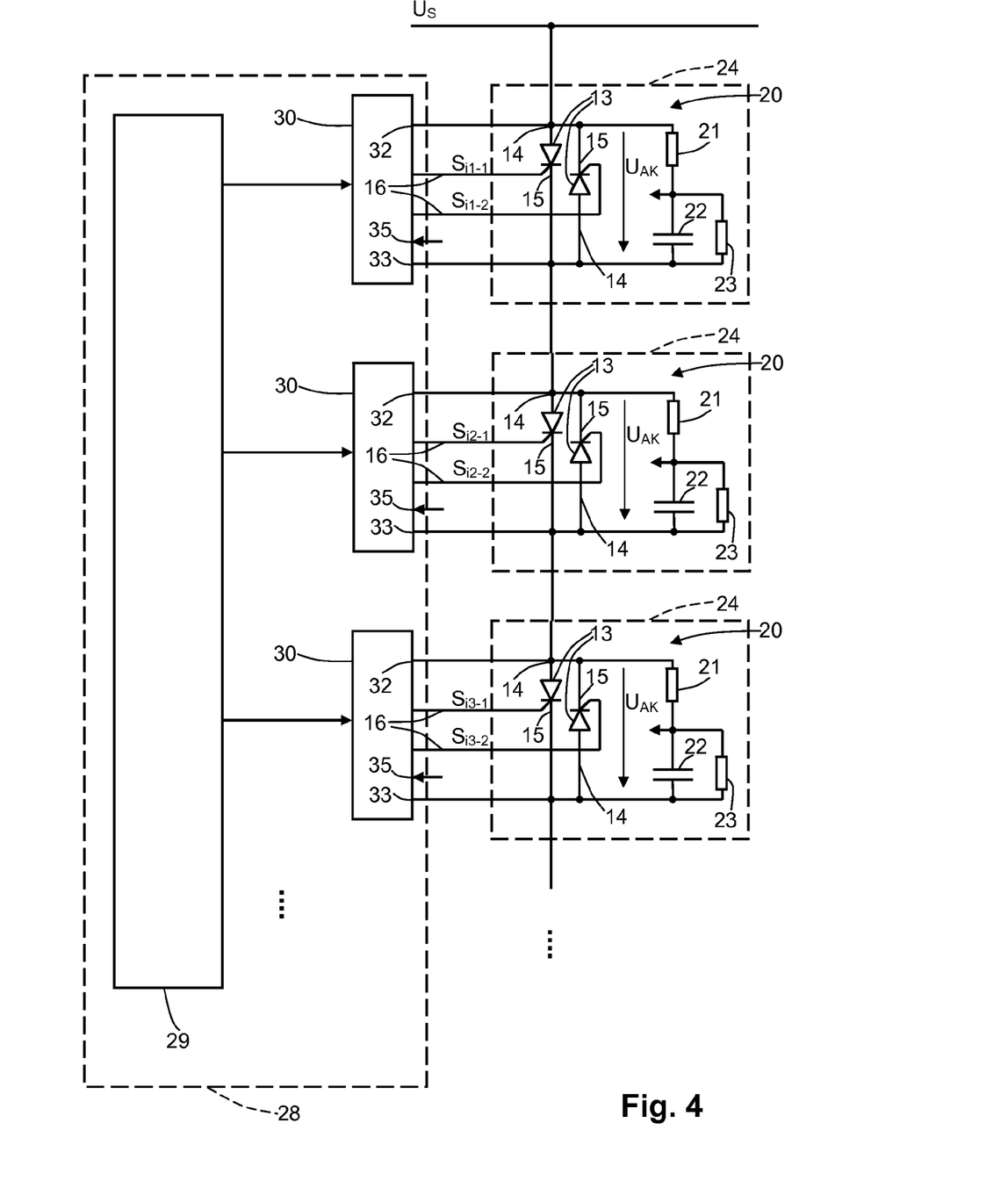

FIG. 1 shows a block diagram of an exemplary embodiment of a circuit arrangement 10. The circuit arrangement 10 comprises a thyristor circuit 11 that has one and, in accordance with the example, several series circuits 12, each with respectively two or more series-connected thyristor groups with one thyristor 13 (FIG. 2) each or with two anti-parallel-connected thyristors 13 (FIG. 4). Each thyristor 13 has an anode terminal 14, a cathode terminal 15, as well as a control input terminal 16.

Furthermore, each thyristor group 24 has an RC member 20. The RC member 20 comprises a series circuit of a first resistor and a capacitor 22. In an embodiment described here, the RC member 20 is additionally associated with a second resistor 23 that is connected parallel to the capacitor 22. FIG. 1 is a schematic illustration of the series circuits 12 with the resistor groups 24. The thyristor groups 24 of FIG. 1 are designed as illustrated in FIG. 2 or 4.

A control device 28 is provided for controlling the thyristor circuit 11. In an embodiment described here, the control device 28 comprises a system control unit 29 that energizes several thyristor drivers 30 individually. Each thyristor 13 or each thyristor group 24 is associated with one thyristor driver 30 of the control device 28. Via a control line 31, each thyristor driver 30 is connected to the control input terminal 16 of the associate thyristor 13 and the associate anti-parallel thyristors 13, respectively. Via a control line 31, the thyristor driver 30 can apply a control signal $S_{ik}$ to the associate control input terminal. In the exemplary embodiment, index i denotes the number of the series circuit 12, while index k denotes the thyristors 13 and the thyristor groups 24, respectively, in the series circuit 12. In the exemplary embodiment illustrated by FIG. 4, said embodiment having two thyristors 13 per thyristor group 24, two control signals $S_{ik-1}$ and $S_{ik-2}$ for the thyristor group 24 are transmitted.

Therefore, the thyristor circuit 11 may represent a thyristor matrix, provided said thyristor circuit comprises several series circuits 12. The thyristors 13 can be energized individually and independently of each other by the control device 28 via a respectively associate control signal $S_{ik}$. The number of thyristors 13 or thyristor groups 24 that are connected sequentially in a series circuit 12 depends on the required blocking voltage that is to be achieved by the series circuit 12.

Figure 2:
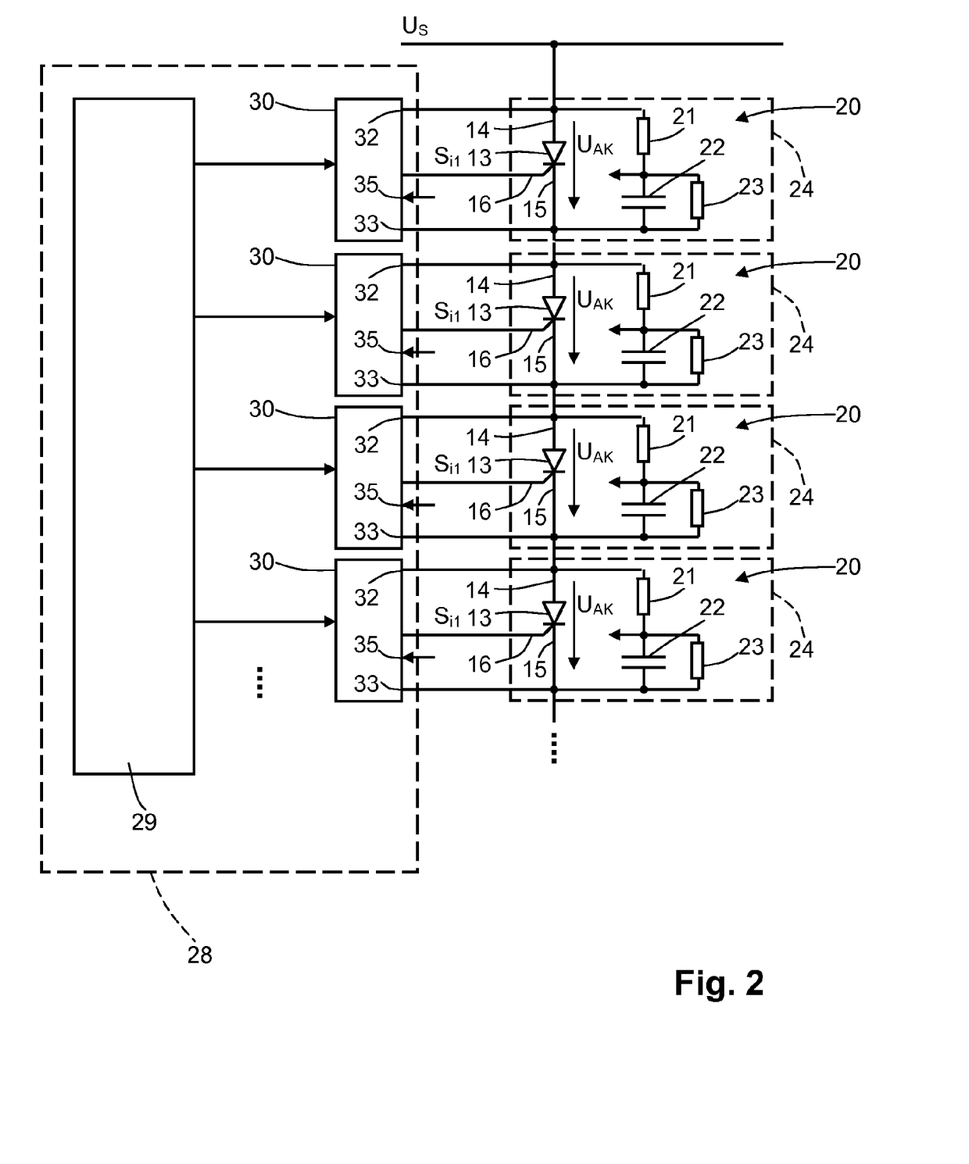

As illustrated by FIG. 2, each thyristor driver 30 of the exemplary embodiment further has a first measuring terminal 32 and a second measuring terminal 33. In the exemplary embodiment shown by FIG. 2, the first measuring terminal 32 is connected to the anode terminal 14 and the second measuring terminal 33 is connected to the cathode terminal 15 of the respectively associate thyristor 13. Correspondingly, referring to the exemplary embodiment of FIG. 4, the first measuring terminal 32 is connected to the anode terminal 14 of the one thyristor and to the cathode terminal 15 of the respectively other thyristor 13, while the second measuring terminal 33 is connected to the cathode terminal 15 of the one thyristor and to the anode terminal 14 of the other thyristor 13. Therefore, the thyristor voltage $U_{AK}$ applied between the anode and the cathode of the thyristor 13 or the thyristors can be measured or determined via the measuring terminals 32, 33 of one thyristor driver 30. Optionally, another, third, measuring terminal 35 may be connected to the connecting point between the first resistor 21 and the capacitor 22. It is possible, for example via the voltage applied to the first resistor, to measure or determine the thyristor current $I_T$ flowing from the anode terminal 14 to the cathode terminal 15 through the thyristor 13 when a thyristor 13 is in conducting condition.

During the operation of the circuit arrangement 10, the thyristor circuit 11 is connected to a supply voltage $U_S$. The supply voltage $U_S$ may be a dc voltage or—as in the exemplary embodiment described here—an ac voltage. On the input side, the supply voltage $U_S$ is connected to the at least one series circuit 12 of the thyristor circuit 11. On the opposite side, each series circuit 12 has an output node 34.

By means of the control device 28 of the circuit arrangement 10 it is possible to test the function and the switching behavior of the thyristors 13 in a test sequence. During the test sequence the thyristors 13 are individually energized in sequence via a respectively associate control signal $S_{ik}$. This is accomplished in such a manner that respectively at least one of the thyristors 13 of a series circuit 12 or respectively at least one of the thyristors of a thyristor circuit 11 is energized via the respective control signal $S_{ik}$ in order to switch the energized thyristor 12 that is to be tested into its conducting condition. The number of blocking thyristors 13 of a series circuit must be sufficiently great during the test sequence in order to bring about a sufficient blocking voltage. The number of thyristors of a series circuit that can be simultaneously switched to conducting condition during a test sequence depends on the dimensioning of the series circuit and on the supply voltage $U_S$. It is sufficient to switch respectively only one thyristor 13 per series circuit 12 into its conducting condition. The required time for a test sequence for a series circuit can be reduced if two or more thyristors 13 per series circuit 12 can be simultaneously switched into their conducting condition.

The test period DT starts with the application of the respective control signal $S_{ik}$ to a thyristor 13. During the test period DT, the respective thyristor 13 can be tested or evaluated regarding its functionality and/or switching behavior.

With reference to FIGS. 3A to 3D and one individual thyristor 13, the testing and evaluation of the switching behavior of the exemplary embodiment shown by FIG. 2 will be explained hereinafter.

Figure 3A:
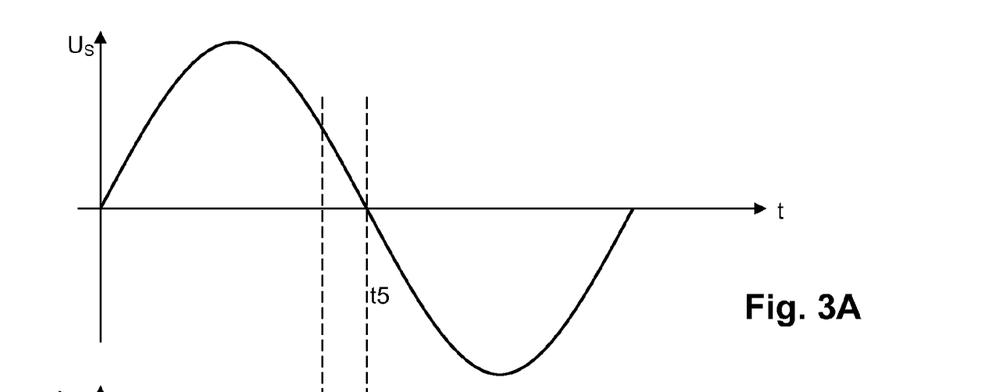

The example of FIG. 3A shows the supply voltage $U_S$ as an ac voltage. In accordance with an embodiment of the invention, the test sequence is performed by the control device 28 in such a manner that, respectively, in the descending branch during a positive half-wave of the supply voltage $U_S$ with a predetermined phase position at a first switching point of time t1, a control signal $S_{ik}$ is generated for the thyristor 13 that is to be currently tested in the test sequence. The appropriate control signal for the subsequent thyristor in the test sequence is generated with the same phase position in a subsequent, for example in the directly subsequent, descending branch of the positive half-wave of the supply voltage $U_S$. In this manner, all the thyristors 13 are sequentially tested. In accordance with the example, the test period ends prior to a fifth switching point of time t5 at which the supply voltage $U_S$ displays the next zero crossing.

Figure 3B:
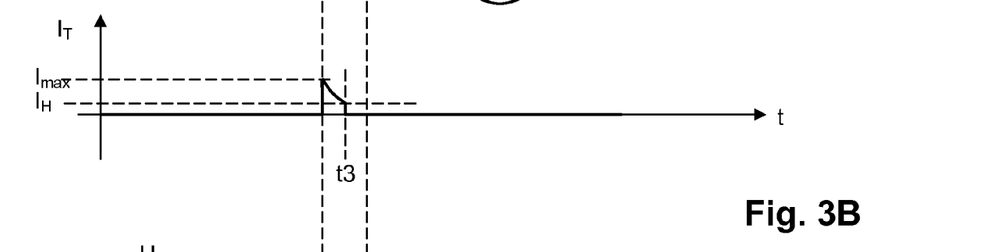
Figure 3C:
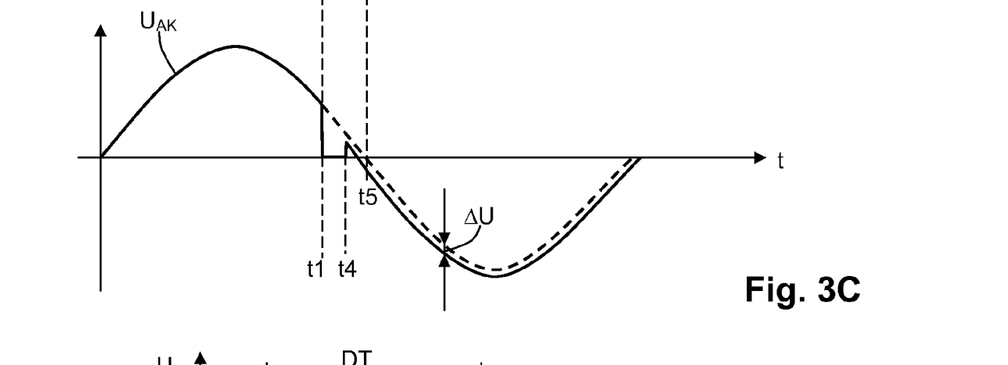

As illustrated by FIGS. 3A to 3C, by applying the control signal $S_{ik}$ at the first switching point of time t1, the associate thyristor 13 is switched into its conducting condition. As a result of this, the thyristor voltage $U_{AK}$ applied to the thyristor 13 decreases. The capacitor 22 of the associate RC member discharges via the conducting thyristor 13 and produces a thyristor current $I_T$ (FIG. 3B). With the increasing discharge of the capacitor 22, the thyristor current $I_T$ decreases. If the thyristor current $I_T$ falls below the value of the holding current $I_H$ that is characteristic of the thyristor 13, the thyristor 13 again transitions into its blocking condition. The thyristor voltage $U_{AK}$ applied to the thyristor is then determined by the supply voltage $U_S$ applied to the series circuit 12. As can be inferred from FIG. 3C, the supply voltage $U_S$ will however not be immediately distributed uniformly to the thyristor groups 24 as a function of the number of thyristor groups 24. Rather, there first remains a voltage difference $\Delta U$ between the thyristor voltage $U_{AK}$ on the conducting and again switched to blocking thyristor group 24 with respect to the starting voltage that would be applied had no switching taken place. The starting voltage is shown in dashed lines in FIG. 3C and can be inferred from the proportion of the supply voltage $U_S$ divided by the number of thyristor groups 24 of the series circuit 12.

This voltage difference $\Delta U$ balances out when all the thyristor groups 24 of the series circuit 12 were in conducting condition once during the test sequence and when switching occurs for all thyristor groups 24 at respectively the same phase angle $\phi$, with respect to a period of the supply voltage $U_S$. The voltage difference $\Delta U$ also balances out during an equalization period in that, depending on the time constant of the RC member 20, the thyristor voltages on the thyristor groups 24 with blocking thyristors 13 will again balance out. A lasting asymmetry of the capacitor voltages due to the second resistor 23 parallel to the capacitors 22 is prevented. Depending on the size of the components and the number of the thyristor groups 24 per series circuit 12, the duration of time for moving through a complete test sequence performed on a series circuit 12, however, is less than the duration of equalization that is a multiple of the time constants of the RC member 20 (product of capacitance of the capacitor 22 and the resistor value of the first resistor 21).

With the use of an electrical parameter and, in accordance with the example, with the use of the thyristor voltage $U_{AK}$ and/or the thyristor current $I_T$ it is thus possible to test whether the thyristor 13 can be switched between the blocking condition and the conducting condition and/or whether the chronological switching behavior satisfies the predetermined requirements.

Figure 3D:
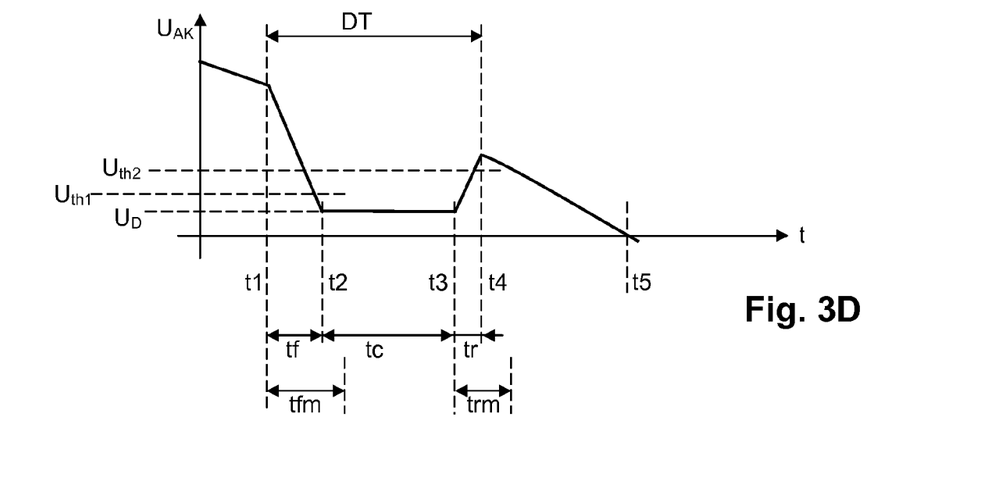

FIG. 3D shows more clearly the chronological sequence, starting at the first switching point of time t1 at which the control signal $S_{ik}$ for switching the thyristor 13 into the conducting condition is applied. After the first switching point of time t1, the thyristor voltage $U_{AK}$ shows a descending flank and, in accordance with the example, reaches a conducting state voltage $U_D$ at a second switching point of time t2. The time period between the first switching point of time t1 and the second switching point of time t2 is referred to as the falling time tf. Starting at the second switching point of time t2 up to the third switching point of time t3, the conducting state voltage $U_D$ is applied to the thyristor for a conducting period tc.

At this third switching point of time t3, the thyristor current $I_T$ falls below the holding current $I_H$. As a result of this, the thyristor 13 is again switched from its conducting condition into its blocking condition, and the thyristor voltage $U_{AK}$ shows a ascending flank as of the third switching point of time t3. During a rising time tr, the thyristor voltage $U_{AK}$ increases and reaches—at a fourth switching point of time t4—a voltage value that is predetermined by the applied supply voltage $U_S$ and by the dimensions and number of the thyristor groups 24 in the series circuit 12. The test period DT is completed at the fourth switching point of time t4.

The thyristor voltage $U_{AK}$ applied to the thyristor 13 can be measured and then evaluated via the measuring terminals 32, 33. This evaluation may be restricted to the comparison of at least one value of the thyristor voltage $U_{AK}$ with at least one predetermined comparative value, or, additionally, there may also be a time-based evaluation.

In an embodiment described here, first a comparison is made during the test period DT to test whether the thyristor voltage $U_{AK}$ after the first switching point of time t1, i.e., after the application of the control signal, falls below a first threshold $U_{th1}$. Optionally, there may be additional testing as to whether this first threshold $U_{th1}$ was not reached within a predetermined conduction delay time tfm. If the thyristor voltage $U_{AK}$ falls below the predetermined first threshold $U_{th1}$, the thyristor 13 is switched from its blocking into its conducting condition. By verifying that a predetermined conduction delay time tfm was maintained it can further be determined whether switching was performed with sufficient rapidity.

As an alternative to testing whether there was a drop below the first threshold $U_{th1}$ it is also possible to test switching into the conducting condition by determining whether the thyristor voltage $U_{AK}$—after the first switching point of time t1—still rises above a predetermined threshold after the application of the control signal. If this is the case, a switching of the thyristor 13 into the conducting condition has not taken place.

In the exemplary embodiment described here, it is further tested whether the thyristor 13 has again switched the holding current $I_H$ from the conducting condition into the blocking condition after the third switching point of time t3, i.e., after the thyristor current $I_T$. To accomplish this, it is tested whether the thyristor voltage $U_{AK}$ rises above a predetermined second threshold $U_{th2}$. The value of the second threshold $U_{th2}$ is greater than that of the first threshold $U_{th1}$. In this event, it may be concluded therefrom that the thyristor 13 was again switched into its blocking condition. Consistent with the first switching process after the start of the first switching point of time t1, it is also possible to test, while switching into the blocking condition after the third switching point of time 3, whether switching was sufficiently rapid. To accomplish this, for example a conduction delay time trm may be prespecified, within which time the thyristor voltage $U_{AK}$ must have sufficiently risen and, in accordance with the example, have risen above the second threshold $U_{th2}$.

Likewise, during the test whether a switching into the blocking condition has occurred, it can be tested whether—instead of a rise above the second threshold $U_{th2}$—a drop below a predetermined threshold after the third switching point of time t3 still does exist. If this should be the case, it will be recorded that a blocking of the thyristor 13 did not take place.

As has been explained the testing and evaluating of the chronological behavior in switching operations is optional. For functional testing of the thyristor 13, it may be sufficient to test only whether the thyristor 13 can be switched from the blocking into the conducting and/or from the conducting back into the blocking conditions.

The thresholds $U_{th1}$ and $U_{th2}$ for the thyristor voltage $U_{AK}$ must be selected depending on the specific exemplary embodiment and the dimensions of the component, as well as depending on the supply voltage $U_S$. For example, the first threshold $U_{th1}$ can be determined as a function of the conducting state voltage $U_D$ of the respective type of thyristor. It is understood that the first threshold $U_{th1}$ is at least as great as the conducting state voltage $U_D$ of the thyristor 13. The second threshold $U_{th2}$ must be set so as to correspond at most to that thyristor voltage $U_{AK}$ that is applied to a thyristor 13 with a completely blocking thyristor 13, depending on the size of the components of the thyristor groups 24 in the series circuit. Therefore, this second threshold $U_{th2}$ also depends on the phase position of the supply voltage $U_S$ at which the test period DT ends.

In modification of the exemplary embodiment illustrated here, it is also possible for a dc voltage to act as the supply voltage $U_S$. In doing so, the described test sequence, likewise, functions as described hereinabove.

In addition to the measurement and/or evaluation of the thyristor voltage $U_{AK}$, it is also possible to measure and evaluate the thyristor current $I_T$. For example, a current threshold could be predetermined, where said threshold must be reached or exceeded after the first switching period of time t1, optionally within a predetermined period of time.

FIG. 4 shows an exemplary embodiment of the thyristor group 24 that has been modified with respect to FIG. 2. The thyristor group 24 comprises not only one thyristor 13 but two anti-parallel connected thyristors 13. The anode of the one thyristor 13 is connected to the cathode of the other thyristor 13. An additional control line 16 exists for the second thyristor 13. Other than that, the thyristor group 24 corresponds to the exemplary embodiment of FIG. 2, so that reference is made to the description hereinabove.

The thyristor group 24 with two anti-parallel connected thyristors 13 can be used if an ac voltage is applied as the supply voltage $U_S$.

Figure 5:
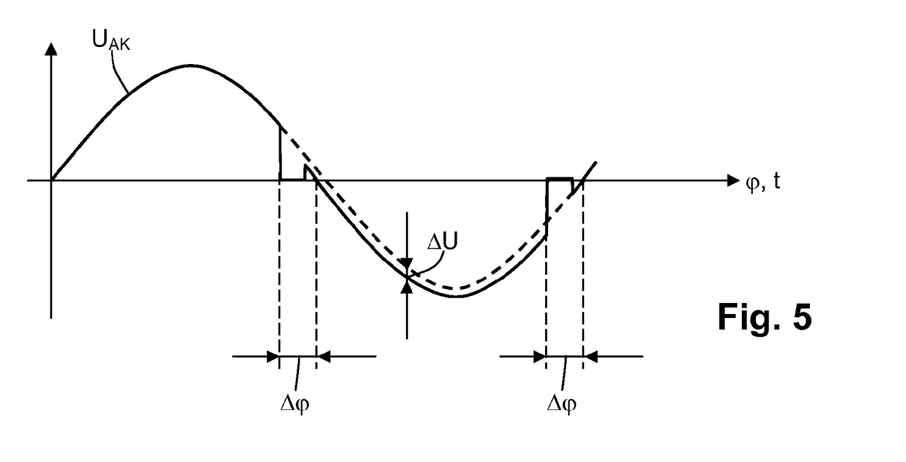

FIG. 5 illustrates the progression of the thyristor voltage $U_{AK}$ applied between the measuring terminal 32 and the measuring terminal 33. The basic function for performing the test sequence corresponds to the previously described exemplary embodiments, so that reference may largely be made to the description hereinabove. Due to the two anti-parallel connected thyristors 13, there is the possibility of balancing out the voltage difference $\Delta U$ that may develop at a thyristor group 24 within a period of the supply voltage $U_S$. FIG. 5 schematically illustrates this principle. During the positive half-wave the one thyristor 13 and during the negative half-wave the respectively other thyristor 13 of the thyristor group 24 can be switched into its conducting condition and back into its blocking condition. In the case of the one thyristor 13, this occurs in the descending branch of the positive half-wave upstream of the zero crossing, and in the case of the other thyristor 13 this occurs in the ascending branch of the negative half-wave upstream of the zero crossing. In doing so, the phase angle difference $\Delta\phi$ at the time of application of the control signal $S_{ij-1}$, $S_{ij-2}$ to the respective thyristor 13 is the same with respect to the subsequent zero crossing. As a result of this, the voltage difference $\Delta U$ for the thyristor group 24 is reduced and, ideally, eliminated completely, as soon as both thyristors 13 have been switched into the once conducting condition in the respective half-wave.

In the exemplary embodiment of FIG. 4 having anti-parallel connected thyristors 13, testing of the thyristors 13 using an electrical parameter, for example the thyristor voltage $U_{AK}$ or the thyristor current $I_T$, may take place analogously as in the embodiment of FIG. 2, so that reference may be made to the corresponding description hereinabove.

If a dc voltage is to be used as the supply voltage $U_S$, the thyristor voltages on the thyristor groups 24 will balance out as a function of the time constants of the RC member 20.

Furthermore, FIG. 3B illustrates the possibility as to how, in addition to the thyristor 13 or the thyristors 13 of a thyristor group 24, the RC member can be evaluated. At the switching point of time t1 the thyristor current $I_T$ increases strongly. Its maximum value $I_{max}$ is characteristic of the resistance of a first resistor 21 of the RC member 20. The maximum value $I_{max}$ of the thyristor current $I_T$ can thus be used, together with the capacitor voltage measured at the first switching point of time t1 between the second measuring terminal 33 and the third measuring terminal 35, for the determination and calculation of the resistance value.

Between the first switching point of time 1 and the third switching point of time t3 the capacitor voltage on the capacitor 22 drops, and the thyristor current $I_T$ decrease as a function of the time constant of the RC member 20. By monitoring the capacitor voltage and/or the thyristor current $I_T$, it is thus possible—by using the resistance of the first resistor 21 measured as described hereinabove—to also determine the capacitance of the capacitor 22. As a result of this, it is also possible to detect changes in the components of the RC member, said changes occurring as a result of aging, for example.

In the exemplary embodiment in accordance with FIGS. 2 and 3, the threshold values relate to positive voltage values because the thyristor group 24 comprises only one thyristor that is able to conduct the current in only one direction. In the exemplary embodiment according to FIGS. 4 and 5, anti-parallel connected thyristors 13 are provided. The thyristor voltage $U_{AK}$ is defined between the first measuring terminal 32 and the second measuring terminal 32; if this thyristor voltage $U_{AK}$ is negative, the thyristor whose anode terminal 14 is associated with the second measuring terminal 33 can become conducting. In this case, the thresholds explained hereinabove are negative. The above-described testing in view of the rising above or falling below the threshold values may be done analogously also in the event of a negative voltage. If the terms "rising above" and "falling below" refer to the respective number of the threshold value, this applies to negative, as well as positive, voltages.

Referring to the exemplary embodiments described here, the test period DT lasts approximately 100 to 800 microseconds. By means of the control device 28 and, in accordance with the example, the thyristor drivers 30, one or two measured values for the thyristor voltage $U_{AK}$ and/or the thyristor current $I_T$ can be measured, in which case the measured values can be resolved with an accuracy of approximately 1 millisecond.

An embodiment of the invention relates to a circuit arrangement 10 with a thyristor circuit 11, as well as to a method for testing the thyristor circuit 11. The thyristor circuit 11 comprises at least one series circuit 12 in which two or more thyristors 13 are connected in series. Each thyristor 13 is parallel-connected to an RC member 20. A control device 28 can energize the thyristors 13 individually and independently of each other by means of a control signal $S_{ik}$, so that each thyristor 13 can be individually switched into its conducting condition. During a test sequence, the thyristors 13 are switched successively in any predeterminable sequence into their conducting condition, wherein—in a series circuit 12 and/or in the thyristor circuit 11—respectively only one thyristor 13 is in its conducting condition. While a thyristor 13 is conducting, the capacitor 22 of the associate RC member 20 discharges and produces a thyristor current $I_T$. As a result of this, the conducting condition is maintained until the thyristor current $I_T$ falls below the holding current $I_H$. The control device 28 can use the thyristor voltage $U_{AK}$ and/or the thyristor current $I_T$ to evaluate the function or the switching behavior of the thyristor 13.

What is claimed is:

1. A circuit arrangement, comprising:
   a thyristor circuit including at least one thyristor having an anode terminal and a cathode terminal; and
   a control device configured to control the at least one thyristor by applying a control signal to the at least one thyristor in order to switch the at least one thyristor into a conducting condition, measure and evaluate the at least one thyristor voltage that is present between the anode terminal and the cathode terminal during a test period subsequent to the application of the control signal, monitor whether the voltage of the at least one thyristor is decreasing during the test period for the evaluation of the voltage of the at least one thyristor, monitor whether the voltage of the at least one thyristor decreases initially and rises subsequently, monitor whether the voltage of the at least one thyristor falls below a first threshold and subsequently rises again and above a second threshold, and monitor whether the voltage of the at least one thyristor rises above the second threshold within a predetermined blocking delay time from a switching point of time.

2. The circuit arrangement of claim 1, wherein the control device is further configured to monitor whether the voltage of the at least one thyristor drops below a predetermined first threshold within a predetermined conduction delay time from the application of the control signal.

3. The circuit arrangement of claim 1, wherein the control device is further configured to monitor whether the voltage of the at least one thyristor rests below a predetermined threshold after falling below the first threshold.

4. The circuit arrangement of claim 1, further comprising an RC-circuit connected to the at least one thyristor, the RC-circuit including a capacitor and a first resistor.

5. The circuit arrangement of claim 4, wherein the capacitor of the RC-circuit discharges after the application of the control signal to the at least one thyristor during the test period, and produces a current of the at least one thyristor through the at least one thyristor.

6. The circuit arrangement of claim 5, wherein the current of the at least one thyristor decreases during the discharge of the capacitor during the test period, and falls below the holding current of the at least one thyristor at a switching point of time.

7. A circuit arrangement, comprising:
   a thyristor circuit including at least one thyristor having an anode terminal and a cathode terminal; and
   a control device configured to control the at least one thyristor by applying a control signal to the at least one thyristor in order to switch the at least one thyristor into a conducting condition, measure and evaluate the voltage of the at least one thyristor that is present between the anode terminal and the cathode terminal of the at least one thyristor during a test period subsequent to the application of the control signal to the at least one thyristor, monitor whether the voltage of the at least one thyristor is decreasing during the test period for the evaluation of the voltage of the at least one thyristor, monitor whether the voltage of the at least one thyristor decreases initially and rises subsequently, and monitor whether the voltage of the at least one thyristor falls below a first threshold and subsequently rises again and above a second threshold.

8. The circuit arrangement of claim 7, wherein the control device is further configured to monitor whether the voltage of the at least one thyristor drops below a predetermined first threshold within a predetermined conduction delay time from the application of the control signal.

9. The circuit arrangement of claim 7, wherein the control device is further configured to monitor whether the voltage of the at least one thyristor rests below a predetermined threshold after falling below the first threshold.

10. The circuit arrangement of claim 7, further comprising an RC-circuit connected to the at least one thyristor, the RC-circuit including a capacitor and a first resistor.

11. The circuit arrangement of claim 10, wherein the capacitor of the RC-circuit discharges after the application of the control signal to the at least one thyristor during the test period, and produces a current of the at least one thyristor through the at least one thyristor.

12. The circuit arrangement of claim 11, wherein the current of the at least one thyristor decreases during the discharge of the capacitor during the test period, and falls below the holding current of the at least one thyristor at a switching point of time.

13. A method for testing a thyristor circuit including at least one thyristor having an anode terminal and a cathode terminal, the method comprising:
- applying a control signal to switch the at least one thyristor into a conducting condition;
- measuring and evaluating the voltage of the at least one thyristor that is present between the anode terminal and the cathode terminal during a test period subsequent to the application of the control signal to the at least one thyristor;
- monitoring whether the voltage of the at least one thyristor is decreasing during the test period for the evaluation of the voltage of the at least one thyristor;
- monitoring whether the voltage of the at least one thyristor decreases initially and rises subsequently; and
- monitoring whether the voltage of the at least one thyristor falls below a first threshold and subsequently rises again and above a second threshold.

\* \* \* \* \*